(12) United States Patent
Yen

(10) Patent No.: US 8,101,966 B2
(45) Date of Patent: *Jan. 24, 2012

(54) LIGHT-EMITTING DIODE LAMP WITH LOW THERMAL RESISTANCE

(75) Inventor: Jui-Kang Yen, Taipei (TW)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/942,872

(22) Filed: Nov. 9, 2010

(65) Prior Publication Data

US 2011/0049559 A1    Mar. 3, 2011

Related U.S. Application Data

(62) Division of application No. 11/279,530, filed on Apr. 12, 2006, now Pat. No. 7,863,639.

(51) Int. Cl.
*H01L 33/00* (2010.01)
(52) U.S. Cl. ............ 257/99; 257/703; 257/E33.058; 257/E33.066; 257/E33.075
(58) Field of Classification Search ............ 257/625, 257/703, 705, E33.051, E2.051, E21.075; 362/218, 264, 547
See application file for complete search history.

(56) References Cited

U.S. PATENT DOCUMENTS

| | | |
|---|---|---|
| 3,715,636 A | 2/1973 | Jaffe et al. |
| 3,885,304 A | 5/1975 | Kaiser et al. |
| 4,918,497 A | 4/1990 | Edmond |
| 4,965,659 A * | 10/1990 | Sasame et al. ............... 257/720 |
| 4,966,862 A | 10/1990 | Edmond |
| 5,027,168 A | 6/1991 | Edmond |
| 5,210,051 A | 5/1993 | Carter, Jr. |
| 5,223,747 A | 6/1993 | Tschulena |
| 5,338,944 A | 8/1994 | Edmond et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |

(Continued)

FOREIGN PATENT DOCUMENTS

JP    55107283 A    8/1980

OTHER PUBLICATIONS

The Bergquist Company, Thermal Management for LED Applications Solutions Guide, pp. 1-6.

(Continued)

*Primary Examiner* — David Vu
*Assistant Examiner* — Earl Taylor
(74) *Attorney, Agent, or Firm* — Patterson & Sheridan, L.L.P.

(57) ABSTRACT

A light-emitting diode (LED) structure with an improved heat transfer path with a lower thermal resistance than conventional LED lamps is provided. For some embodiments, a surface-mountable light-emitting diode structure is provided having an active layer deposited on a metal substrate directly bonded to a metal plate that is substantially exposed for low thermal resistance by positioning it on the bottom of the light-emitting diode structure. This metal plate can then be soldered to a printed circuit board (PCB) that includes a heat sink. For some embodiments of the invention, the metal plate is thermally and electrically conductively connected through several heat conduction layers to a large heat sink that may be included in the structure.

8 Claims, 2 Drawing Sheets

U.S. PATENT DOCUMENTS

| | | | |
|---|---|---|---|
| 5,631,190 | A | 5/1997 | Negley |
| 5,739,554 | A | 4/1998 | Edmond et al. |
| 5,785,418 | A | 7/1998 | Hochstein |
| 5,857,767 | A | 1/1999 | Hochstein |
| 5,912,477 | A | 6/1999 | Negley |
| 6,187,606 | B1 | 2/2001 | Edmond et al. |
| 6,197,859 | B1 | 3/2001 | Green et al. |
| 6,201,262 | B1 | 3/2001 | Edmond et al. |
| 6,274,924 | B1 | 8/2001 | Carey et al. |
| 6,319,778 | B1 * | 11/2001 | Chen et al. ............ 438/273 |
| 6,399,209 | B1 | 6/2002 | Misra et al. |
| 6,531,328 | B1 | 3/2003 | Chen |
| 6,555,405 | B2 * | 4/2003 | Chen et al. ............ 438/22 |
| 6,614,103 | B1 | 9/2003 | Durocher et al. |
| 6,649,325 | B1 | 11/2003 | Gundale et al. |
| 6,657,297 | B1 | 12/2003 | Jewram et al. |
| 6,919,631 | B1 | 7/2005 | Hoffman et al. |
| 6,921,927 | B2 | 7/2005 | Ng et al. |
| 7,244,965 | B2 * | 7/2007 | Andrews et al. ............ 257/98 |
| 7,309,881 | B2 * | 12/2007 | Sato et al. ............ 257/98 |
| 7,465,592 | B2 * | 12/2008 | Yoo ............ 438/22 |
| 7,854,535 | B2 * | 12/2010 | Weng et al. ............ 362/296.07 |
| 2002/0123164 | A1 | 9/2002 | Slater et al. |
| 2002/0137244 | A1 * | 9/2002 | Chen et al. ............ 438/22 |
| 2003/0006418 | A1 | 1/2003 | Emerson et al. |
| 2003/0173575 | A1 * | 9/2003 | Eisert et al. ............ 257/95 |
| 2003/0187116 | A1 | 10/2003 | Misra et al. |
| 2003/0189829 | A1 | 10/2003 | Shimizu et al. |
| 2004/0004435 | A1 | 1/2004 | Hsu |
| 2004/0029362 | A1 | 2/2004 | Liu |
| 2004/0041222 | A1 | 3/2004 | Loh |
| 2004/0056260 | A1 | 3/2004 | Slater et al. |
| 2004/0079957 | A1 | 4/2004 | Andrews et al. |
| 2004/0164311 | A1 | 8/2004 | Uemura |
| 2004/0173804 | A1 | 9/2004 | Yu |
| 2005/0040425 | A1 * | 2/2005 | Akita ............ 257/103 |
| 2005/0063187 | A1 * | 3/2005 | Weng et al. ............ 362/296 |
| 2005/0073840 | A1 | 4/2005 | Chou et al. |
| 2005/0077532 | A1 | 4/2005 | Ota et al. |
| 2005/0162069 | A1 * | 7/2005 | Ota et al. ............ 313/501 |
| 2005/0168992 | A1 | 8/2005 | Hirose |
| 2005/0173708 | A1 | 8/2005 | Suehiro et al. |
| 2005/0211997 | A1 | 9/2005 | Suehiro et al. |
| 2005/0237747 | A1 | 10/2005 | Shimizu et al. |
| 2006/0043402 | A1 * | 3/2006 | Suehiro et al. ............ 257/99 |
| 2006/0054913 | A1 | 3/2006 | Hadame et al. |
| 2006/0060867 | A1 | 3/2006 | Suehiro |
| 2006/0124941 | A1 | 6/2006 | Lee et al. |
| 2006/0147746 | A1 * | 7/2006 | Wakako et al. ............ 428/627 |
| 2006/0171152 | A1 * | 8/2006 | Suehiro et al. ............ 362/363 |
| 2006/0202216 | A1 * | 9/2006 | Itonaga ............ 257/94 |
| 2007/0029569 | A1 * | 2/2007 | Andrews ............ 257/99 |
| 2007/0034305 | A1 | 2/2007 | Suh |

OTHER PUBLICATIONS

Horng et al., High-Power AlGaInP Light-Emitting Diodes with Patterned Copper Substrates by Electroplating, Japanese Journal of Applied Physics, vol. 43, No. 4B, 2004, pp. L576-L578.

Petroski, Spacing of High-Brightness LEDs on Metal Substrate PCB's for Proper Thermal Performance, IEEE 2004 Inter Society Conference on Thermal Phenoma, pp. 507-514.

USPTO Office Action dated Jun. 11, 2008, corresponding to U.S. Appl. No. 11/279,530.

USPTO Final Office Action dated Jan. 9, 2009, corresponding to U.S. Appl. No. 11/279,530.

USPTO Office Action dated May 12, 2009, corresponding to U.S. Appl. No. 11/279,530.

USPTO Final Office Action dated Dec. 29, 2009, corresponding to U.S. Appl. No. 11/279,530.

* cited by examiner

LIGHT-EMITTING DIODE LAMP WITH LOW THERMAL RESISTANCE

CROSS-REFERENCE TO RELATED APPLICATIONS

This application is a divisional of U.S. patent application Ser. No. 11/279,530, filed Apr. 12, 2006 now U.S. Pat. No. 7,863,639, which is herein incorporated by reference in its entirety.

FIELD OF THE INVENTION

The invention relates to the field of light-emitting diode (LED) lamp technology and, more particularly, to LED lamp packaging.

BACKGROUND OF THE INVENTION

Heat transfer management is a concern for designers of light-emitting diode (LED) lamps that wish to increase efficiency, thereby advancing LED lamps closer to being cost competitive with traditional incandescent and fluorescent lighting for the same amount of luminous output. When LED lamps are driven with high currents, high device temperatures may occur because of insufficient heat transfer from the p-n junction of the semiconductor active layer to the ambient environment. Such high temperatures can harm the semiconductor and lead to such degradations as accelerated aging, separation of the LED chip from the lead frame, and breakage of bond wires. In addition to the aforementioned problems, the optical properties of the LED vary with temperature, as well. As an example, the light output of an LED typically decreases with increased junction temperature. Also, the emitted wavelength can change with temperature due to a change in the semiconductor's bandgap energy.

The main path for heat dissipation (thermal path) in prior art is from the p-n junction to the lead frame and then through the ends of the leads via heat conduction. At the ends of the leads, heat conduction, convection and radiation serve to transfer heat away from the LED when mounted on a printed circuit board. There is also a secondary path of heat conduction from the surface of the semiconductor die to the surface of the plastic casing. The problem with this design is that the majority of the lead frame sits within the plastic casing, which acts as a thermal insulator, and the main thermal path for heat conduction out of the device is limited by the size of the leads. Even designs that have added to the size or number of leads in an effort to promote heat transfer still possess an inherent bottleneck for heat dissipation, as the leads are still sandwiched in the thermally insulative plastic casing.

Accordingly, what is needed is a technique to packaging LED lamps that improves heat dissipation.

SUMMARY OF THE INVENTION

One embodiment of the invention provides a light-emitting diode (LED) structure. The structure generally includes a light-emitting diode semiconductor active layer deposited on a metal substrate enclosed in a casing, a secondary metal plate electrically connected to a bond pad on the active layer, and a primary metal plate electrically and thermally conductively connected to the metal substrate via a metal bonding layer, wherein the primary and secondary metal plates are exposed through a bottom portion of the casing and provide external electrical connections to the light-emitting diode structure.

Another embodiment of the invention provides a different LED structure. The structure generally includes a light-emitting diode semiconductor active layer deposited on a metal substrate enclosed in a casing, a secondary metal plate electrically connected to a bond pad on the active layer and exposed through a bottom portion of the casing, and a primary metal plate having an upper and a lower tier, wherein the upper tier of the primary metal plate is electrically and thermally conductively connected to the metal substrate via a first metal bonding layer and enclosed in the casing and the lower tier of the primary metal plate is exposed through a bottom portion of the casing.

Another embodiment of the invention provides a different LED structure than the previous two embodiments. The structure generally includes a light-emitting diode semiconductor active layer deposited on a metal substrate enclosed in a casing, a secondary metal plate electrically connected to a bond pad on the active layer, and a primary metal plate electrically and thermally conductively connected to the metal substrate via a first metal bonding layer, wherein the primary and secondary metal plates are positioned at an interior bottom surface of the casing and extend laterally through the casing to provide external electrical connections for the light-emitting diode structure.

DETAILED DESCRIPTION OF THE PREFERRED EMBODIMENTS

Embodiments of the present invention provide an improved heat transfer path with a lower thermal resistance than conventional LED lamps. For some embodiments a surface-mountable light-emitting diode structure is provided comprising an active layer deposited on a metal substrate directly bonded to a metal plate that is substantially exposed for low thermal resistance by positioning it on the bottom of the light-emitting diode structure. This metal plate can then be soldered to a printed circuit board (PCB) that includes a heat sink. For some embodiments of the invention, the metal plate is thermally and electrically conductively connected through several heat conduction layers to a large heat sink included in the structure.

Figure 1:
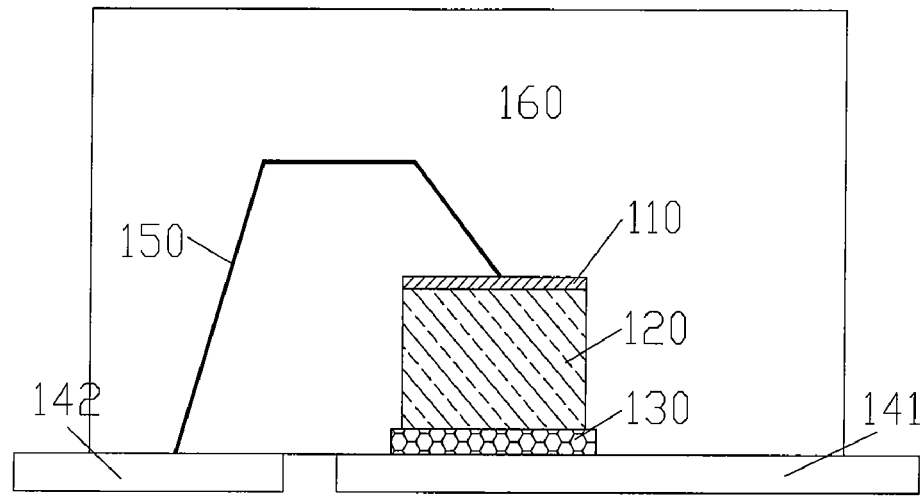
FIG. 1 is a cross-sectional schematic representation of a low thermal resistance LED lamp according to one embodiment of the invention.

FIG. 1 is a cross-sectional schematic representation of a light-emitting diode (LED) lamp with low thermal resistance, in accordance with a first embodiment of the invention. This schematic shows an LED semiconductor active layer 110 that may be composed of AlInGaN or AlInGaP. To create electrical properties characteristic of a diode, one side of the active layer 110 is doped with intentional impurities to create a p-doped side (not shown), while an n-doped side (also not shown) is created on another side of the active layer 110. Deposited on a metal substrate 120 that may consist of copper, a copper alloy, or a composite metal alloy, the active layer 110 can represent multiple dies. The p-doped side of the active layer 110 may be intimately coupled to the metal substrate 120 for efficient heat transfer immediately away from the active layer 110.

Sandwiched between the metal substrate 120 and a primary metal plate 141 for external connection is a metal bonding layer 130 that may consist of a metal solder such as Au—Sn, Ag—Sn or a Sn alloy. The metal bonding layer 130 thermally and electrically conductively connects the active layer 110 and metal substrate 120 to the primary metal plate 141. A secondary metal plate 142 may be electrically connected to a bond pad on the active layer 110 through a bond wire 150, made of a conductive material, such as gold. For some embodiments the primary metal plate 141 may be made as large as possible (within the dimensions of the LED lamp package) in an effort to allow for greater heat transfer and, in such cases, will typically be larger than the secondary metal plate 142.

The active layer 110, the metal substrate 120, and the metal bonding layer 130 may be positioned at the bottom of the LED lamp sitting directly atop the primary metal plate 141, which may result in lower thermal resistance and better heat-sinking capability than the prior art. The LED lamp may be enclosed in a casing 160 composed of an insulating material such as silicone or epoxy in an effort to direct the emitted light. Both metal plates 141, 142, and especially the primary metal plate 141, may extend beyond the casing 160 for better heat conduction to a mounting surface.

Figure 2:
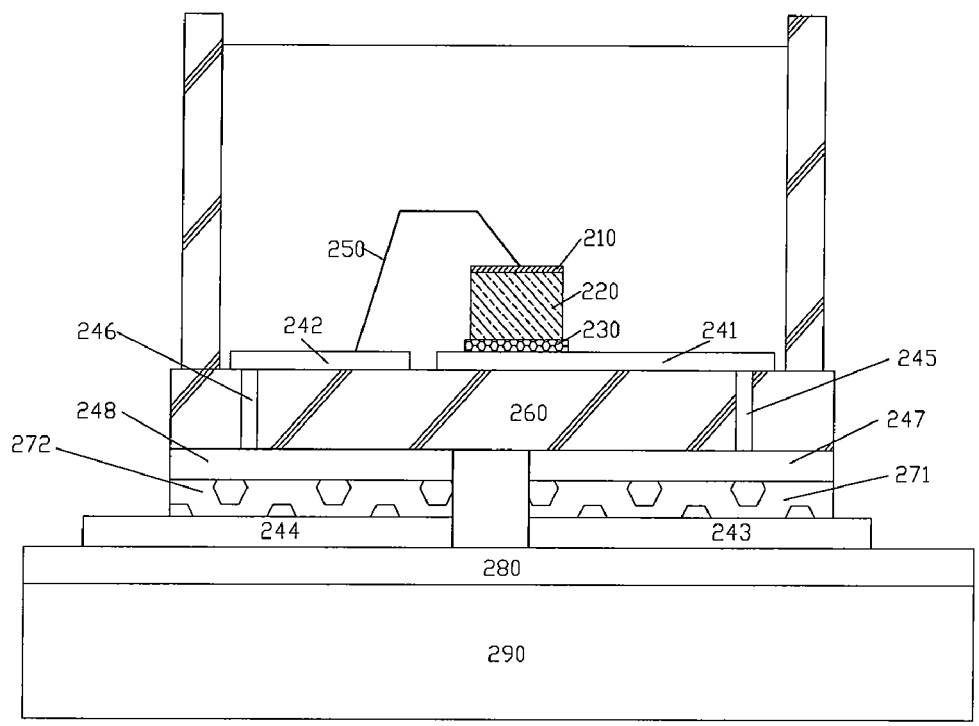
FIG. 2 is a cross-sectional schematic representation of a low thermal resistance LED lamp according to one embodiment of the invention.

FIG. 2 is a cross-sectional schematic representation of a light-emitting diode (LED) lamp with low thermal resistance, in accordance with another embodiment of the invention. Unlike the previous embodiment, this embodiment includes a heat sink 290 and the thermally conductive paths to it. This schematic shows an LED semiconductor active layer 210 that may be composed of AlInGaN or AlInGaP deposited on a metal substrate 220 that may consist of copper, a copper alloy, or a composite metal alloy. The active layer 210 can represent multiple dies. Sandwiched between the metal substrate 220 and a primary metal plate 241 for external connection is a metal bonding layer 230 that may consist of a metal solder such as Au—Sn, Ag—Sn or a Sn alloy. The metal bonding layer 230 thermally and electrically conductively connects the active layer 210 and metal substrate 220 to the primary metal plate 241. A secondary metal plate 242 may be electrically connected to a bond pad on the active layer 210 through a bond wire 250, made of a conductive material, such as gold. For some embodiments, the surface area of the primary metal plate 241 may be made as large as possible (within the dimensions of the LED lamp package) in an effort to allow for greater heat transfer and, in such cases, will typically be larger than the surface area of the secondary metal plate 242. The thickness of these metal plates 241, 242 is normally 1 to 20 µm.

The active layer 210, the metal substrate 220, the metal bonding layer 230, the bonding wire 250, and an upper tier of the metal plates 241, 242 may be enclosed in a casing 260 composed of a ceramic insulating material such as aluminum nitride (AlN) or alumina ($Al_2O_3$) that also serves to direct the emitted light. The active layer 210, the metal substrate 220, and the metal bonding layer 230 may be situated directly atop the primary metal plate 241 and positioned at the interior bottom surface of the casing 260, which may result in lower thermal resistance and better heat-sinking capability than the prior art. Metal vias 245, 246 may pass through the ceramic casing 260 and connect the upper tier of the metal plates 241, 242 to a lower tier of the metal plates 247, 248 beneath the casing 260. An additional metal bonding layer 271 (272) also composed of Au—Sn, Ag—Sn, or Sn alloy may be situated between the lower tier of the metal plate 247 (248) and a first conductivity layer 243 (second conductivity layer 244) to thermally and electrically conductively connect them. The conductivity layers 243, 244 may be metal or printed circuit boards incorporating additional circuitry, and these are where external connections to the second embodiment of the invention can be located. Directly beneath the conductivity layers 243, 244 may reside a dielectric layer 280. Composed of anodized aluminum to provide electrical isolation, the dielectric layer 280 provides adequate heat conduction between the conductivity layers 243, 244 and the heat sink 290 that may be located just beneath it.

Figure 3:
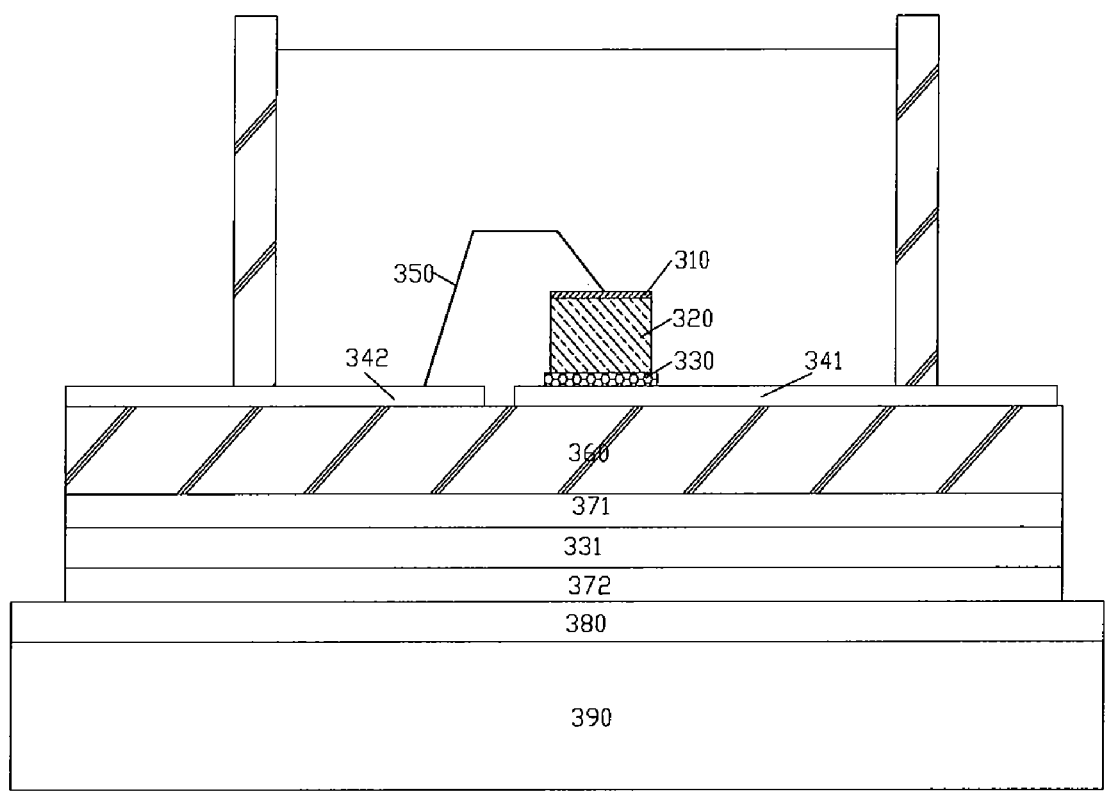
FIG. 3 is a cross-sectional schematic representation of a low thermal resistance LED lamp according to one embodiment of the invention.

FIG. 3 is a cross-sectional schematic representation of a light-emitting diode (LED) lamp with low thermal resistance, in accordance with another embodiment of the invention. Similar to the previous embodiment, this embodiment also includes a heat sink 390 and the thermally conductive paths to it. This schematic shows an LED semiconductor active layer 310 that may be composed of AlInGaN or AlInGaP deposited on a metal substrate 320 that may consist of copper, a copper alloy, or a composite metal alloy. The active layer 310 can represent multiple dies. Sandwiched between the metal substrate 320 and a primary metal plate 341 for external connection is a metal bonding layer 330 consisting of a metal solder such as Au—Sn, Ag—Sn, or a Sn alloy. The metal bonding layer 330 thermally and electrically conductively connects the active layer 310 and metal substrate 320 to the primary metal plate 341. A secondary metal plate 342 may be electrically connected to a bond pad on the active layer 310 through a bond wire 350, made of a conductive material, such as gold. For some embodiments, the surface area of the primary metal plate 341 may be made as large as possible (within the dimensions of the LED lamp package) in an effort to allow for greater heat transfer and, in such cases, will typically be larger than the surface area of the secondary metal plate 342. External connections to this embodiment of the invention can be made at the metal plates 341, 342, and the thickness of these metal plates 341, 342 is normally 1 to 20 µm.

The active layer 310, the metal substrate 320, the metal bonding layer 330, the bonding wire 350, and a portion of the metal plates 341, 342 may be enclosed in a casing 360 composed of a ceramic insulating material such as aluminum nitride (AlN) or alumina ($Al_2O_3$) that also serves to direct the emitted light. The active layer 310, the metal substrate 320, and the metal bonding layer 330 may be situated directly atop the primary metal plate 341 and positioned at the interior bottom surface of the casing 360, which may result in lower thermal resistance and better heat-sinking capability than the prior art. Lying directly underneath the casing 360 may be an upper thermal conductivity layer 371 consisting of Ag paste, Au paste, or another type of suitable metal paste. A second metal bonding layer 331 also composed of Au—Sn, Ag—Sn or Sn alloy may be situated between the upper thermal conductivity layer 371 and a lower thermal conductivity layer 372. The lower thermal conductivity layer 372 may consist of Ag paste, Au paste, or another suitable type of metal paste. Directly beneath the lower thermal conductivity layer 372 may reside a dielectric layer 380. Composed of anodized aluminum to provide electrical isolation, the dielectric layer 380 provides adequate heat conduction between the lower thermal conductivity layer 372 and a heat sink 390 that may be located just beneath it.

Although the invention is illustrated and described herein as embodied in a surface-mountable light-emitting diode lamp structure, it is nevertheless not intended to be limited to the details shown, since various modifications and structural changes may be made therein without departing from the spirit of the invention and within the scope and range of equivalents of the claims.

What is claimed is:

1. A light-emitting diode structure comprising:
   a light-emitting diode semiconductor active layer deposited on a metal substrate enclosed in a casing;
   a secondary metal plate electrically connected to a bond pad on the active layer;
   a primary metal plate electrically and thermally conductively connected to the metal substrate via a first metal bonding layer, wherein the primary and secondary metal plates are positioned at an interior bottom surface of the casing and extend laterally through the casing to provide external electrical connections for the light-emitting diode structure;
   an upper thermal conductivity layer situated below a bottom surface of the casing;
   a second metal bonding layer situated between the upper thermal conductivity layer and a lower thermal conductivity layer; and
   a dielectric layer for heat conduction sandwiched between the lower thermal conductivity layer and a heat sink, wherein the heat sink is exposed at a bottom of the light-emitting diode structure.

2. The light-emitting diode structure of claim 1 wherein the casing comprises at least one of aluminum nitride (AlN) or alumina ($Al_2O_3$).

3. The light-emitting diode structure of claim 1 wherein the first and second metal bonding layers comprise at least one of Au—Sn, Ag—Sn or a Sn alloy.

4. The light-emitting diode structure of claim 1 wherein the upper and lower conductivity layers comprise at least one of silver (Ag) paste or gold (Au) paste.

5. The light-emitting diode structure of claim 1 wherein the dielectric layer comprises anodized aluminum.

6. A light-emitting diode structure comprising:
   a light-emitting diode semiconductor active layer deposited on a metal substrate enclosed in a casing;
   a secondary metal plate electrically connected to a bond pad on the active layer;
   a primary metal plate electrically and thermally conductively connected to the metal substrate via a first metal bonding layer, wherein the primary and secondary metal plates are positioned at an interior bottom surface of the casing and extend laterally beyond an upper portion of the casing to provide external electrical connections for the light-emitting diode structure; and
   an upper thermal conductivity layer situated below a bottom surface of the casing.

7. The light-emitting diode structure of claim 6, further comprising:
   a second metal bonding layer situated between the upper thermal conductivity layer and a lower thermal conductivity layer.

8. The light-emitting diode structure of claim 7, further comprising:
   a dielectric layer for heat conduction sandwiched between the lower thermal conductivity layer and a heat sink, wherein the heat sink is exposed at a bottom of the light-emitting diode structure.

* * * * *